(12) United States Patent
Gunawan et al.

(10) Patent No.: US 11,585,871 B1
(45) Date of Patent: Feb. 21, 2023

(54) RAPID CARRIER-RESOLVED PHOTO-HALL ANALYSIS

(71) Applicant: International Business Machines Corporation, Armonk, NY (US)

(72) Inventors: Oki Gunawan, Westwood, NJ (US); Devendra K. Sadana, Pleasantville, NY (US); Douglas Bishop, Tarrytown, NY (US); Tze-Chiang Chen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/643,985

(22) Filed: Dec. 13, 2021

(51) Int. Cl.
*G01R 33/07* (2006.01)

(52) U.S. Cl.
CPC ................... *G01R 33/072* (2013.01)

(58) Field of Classification Search
CPC .................................................. G01R 33/072
See application file for complete search history.

(56) References Cited

U.S. PATENT DOCUMENTS

| | | |
|---|---|---|
| 4,346,348 A | 8/1982 | Bartoli et al. |
| 4,816,755 A | 3/1989 | Look et al. |
| 6,177,802 B1 | 1/2001 | Shabde et al. |
| 9,041,389 B2 | 5/2015 | Gokmen et al. |
| 9,689,935 B2 | 6/2017 | Lin et al. |
| 10,197,640 B2 | 2/2019 | Gunawan |
| 11,041,827 B2 | 6/2021 | Gunawan et al. |
| 2016/0299104 A1* | 10/2016 | Gunawan ............... G01R 33/07 |
| 2016/0299201 A1* | 10/2016 | Gunawan ............... G01R 33/07 |
| 2018/0095147 A1* | 4/2018 | Gunawan ............... G01R 33/12 |
| 2019/0227131 A1* | 7/2019 | Gunawan ............... G01B 11/14 |
| 2020/0326306 A1* | 10/2020 | Gunawan ............... G01N 27/72 |

OTHER PUBLICATIONS

Gunawan et al., "Carrier-resolved photo-Hall effect." Nature, vol. 575, No. 7781, 2019, pp. 151-155.

(Continued)

*Primary Examiner* — Alvaro E Fortich
(74) *Attorney, Agent, or Firm* — Kelsey M. Skodie (57) ABSTRACT

A system for and methods of semiconductor testing and characterization are disclosed. The system includes a parallel dipole line (PDL) system for applying a magnetic field to a sample in a measurement chamber and electrical equipment for testing the sample. The testing includes applying a first light exposure to the sample with the PDL system set to zero magnetic field and monitoring longitudinal resistance ($R_{xx}$) of the sample as intensity of the first light exposure varies. A second light exposure is applied with the PDL system set to maximum magnetic field, and transverse magnetoresistance ($R_{B+}$) is monitored as light intensity varies. A third light exposure is applied with the PDL system set to minimum magnetic field, and transverse magnetoresistance ($R_{B-}$) is monitored as light intensity varies. The characterization includes carrying out a photo-Hall analysis based on data from the testing.

20 Claims, 5 Drawing Sheets

(56) References Cited

OTHER PUBLICATIONS

Seiler, et al. "Hg1—xCdxTe characterization measurements: current practice and future needs," Semiconductor Science and Technology, vol. 8, No. 6S, 1993, pp. 753-776.
Sinton, et al. "Contactless determination of current-voltage characteristics and minority-carrier lifetimes in semiconductors from quasi-steady-state photoconductance data" Appl. Phys. Lett. 69, 2510 (1996), 4 pgs.

* cited by examiner

RAPID CARRIER-RESOLVED PHOTO-HALL ANALYSIS

BACKGROUND

The present disclosure relates to semiconductor characterization and, more specifically, to carrier resolved photo-Hall measurements.

Hall effect measurements are semiconductor characterization techniques used to find properties of charge carriers in a material. A Hall effect measurement can involve passing electric current through the sample and subjecting the sample to a perpendicular magnetic field. The longitudinal resistance of the sample can be measured under zero magnetic field, and the transverse resistance of the sample can be measured under an applied magnetic field. This can be used to find carrier type, charge density, and mobility for a majority carrier. Carrier-resolved photo-Hall (CRPH) measurements utilize an alternating current (AC) field Hall measurement system using a rotating parallel dipole line (PDL) magnet system and a formula for determining the difference between hole mobility and electron mobility based on Hall effect measurements in the presence of light. Based on the mobility difference, parameters such as mobility, carrier density, and diffusion lengths for both electrons and holes can be found.

SUMMARY

Various embodiments are directed to a system that includes a parallel dipole line (PDL) system for applying a magnetic field to a sample in a measurement chamber and electrical equipment configured to test the sample. The testing includes applying a first light exposure to the sample with the PDL system set to zero magnetic field and monitoring longitudinal resistance ($R_{xx}$) of the sample as intensity of the first light exposure varies. A second light exposure is applied with the PDL system set to maximum magnetic field, and transverse magnetoresistance ($R_{B+}$) is monitored as light intensity varies. A third light exposure is applied with the PDL system set to minimum magnetic field, and transverse magnetoresistance ($R_{B-}$) is monitored as light intensity varies. The electrical equipment can include a source meter unit, a switch matrix unit, a voltmeter, and a photodetector. The photodetector can monitor light intensity in the measurement chamber. The system can also include a data analysis module that can determine, based on the monitored $R_{xx}$, conductivity σ of the sample as a function of time and, based on the monitored $R_{B+}$ and $R_{B-}$, Hall coefficient H of the sample as a function of time. The data analysis module can also generate a σ-H curve for the sample. In some embodiments, applying each of the first, second, and third light exposures includes slowly varying the light intensities. In further embodiments, applying each of the first, second, and third light exposures includes applying a light pulse.

The method of characterization includes carrying out a photo-Hall analysis of a sample based on testing the sample. The method of testing includes applying a first light exposure to the sample with the PDL system set to zero magnetic field and monitoring longitudinal resistance ($R_{xx}$) of the sample as light intensity of the first light exposure varies. With the PDL system set to maximum magnetic field, a second light exposure is applied to the sample, and transverse magnetoresistance ($R_{B+}$) of the sample is monitored as light intensity of the second light exposure varies. With the PDL system set to minimum magnetic field, a third light exposure is applied to the sample, and transverse magnetoresistance ($R_{B-}$) of the sample is monitored as light intensity of the third light exposure varies.

Additional embodiments of the present disclosure are directed to a method of semiconductor testing, which includes mounting a sample in a measurement chamber with a parallel dipole line (PDL) system. With the PDL system set to zero magnetic field, a first light exposure is applied to the sample, and longitudinal resistance ($R_{xx}$) of the sample is monitored as light intensity of the first light exposure varies. A second light exposure is applied with the PDL system set to maximum magnetic field, and transverse magnetoresistance ($R_{B+}$) is monitored as light intensity varies. A third light exposure is applied with the PDL system set to minimum magnetic field, and transverse magnetoresistance ($R_{B-}$) is monitored as light intensity varies. In some embodiments, applying each of the first, second, and third light exposures includes slowly varying the light intensities. In further embodiments, applying each of the first, second, and third light exposures includes applying a light pulse. The method can also include determining, based on the monitored $R_{xx}$, conductivity σ of the sample as a function of time and determining, based on the monitored $R_{B+}$ and $R_{B-}$, Hall coefficient H of the sample as a function of time. A σ-H curve for the sample can then be generated. Further, a Hall mobility difference $\Delta\mu_H$ for the sample can be found using the following equation:

$$\Delta\mu_H = \frac{d(\sigma^2 H)}{d\sigma} = \left(2 + \frac{d\ln H}{d\ln\sigma}\right)\sigma H,$$

which allows determination of a mobility ratio for the sample. The method can also include determining sample parameters such as photo carrier density Δn, hole mobility $\mu_P$, electron mobility $\mu_N$, recombination lifetime τ, hole diffusion length $L_{D,P}$, electron diffusion length $L_{D,N}$, and ambipolar diffusion length $L_{D,am}$.

Further embodiments are directed to a method of semiconductor characterization that includes carrying out a photo-Hall analysis of a sample based on testing the sample in a measurement chamber with a parallel dipole line (PDL) system. With the PDL system set to zero magnetic field, a first light exposure is applied to the sample, and longitudinal resistance ($R_{xx}$) of the sample is monitored as light intensity of the first light exposure varies. A second light exposure is applied with the PDL system set to maximum magnetic field, and transverse magnetoresistance ($R_{B+}$) is monitored as light intensity varies. A third light exposure is applied with the PDL system set to minimum magnetic field, and transverse magnetoresistance ($R_{B-}$) is monitored as light intensity varies. The photo-Hall analysis can include determining, based on the monitored $R_{xx}$, conductivity σ of the sample as a function of time and determining, based on the monitored $R_{B+}$ and $R_{B-}$, Hall coefficient H of the sample as a function of time. A σ-H curve for the sample can then be generated.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings, and will be described in detail. It should be understood, however, that the intention is not to limit the invention to the particular embodiments described. Instead, the intention is to cover all modifications, equivalents, and alternatives falling within the spirit and scope of the invention.

DETAILED DESCRIPTION

Embodiments of the present invention are generally directed to semiconductor characterization and, more specifically, to carrier resolved photo-Hall measurements. While the present disclosure is not necessarily limited to such applications, various aspects of the disclosure may be appreciated through a discussion of examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "over," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects and/or combinations of aspects as described in the specification and the claims.

Unless otherwise noted, ranges (e.g., time, concentration, temperature, etc.) indicated herein include both endpoints and all numbers between the endpoints. Unless specified otherwise, the use of a tilde (~) or terms such as "about," "substantially," "approximately," "slightly less than," and variations thereof are intended to include the degree of error associated with measurement of the particular quantity based upon the equipment available at the time of filing the application. For example, "about" can include a range of ±8% or 5%, or 2% of a given value, range of values, or endpoints of one or more ranges of values. Unless otherwise indicated, the use of terms such as these in connection with a range applies to both ends of the range (e.g., "approximately 1 g-5 g" should be interpreted as "approximately 1 g—approximately 5 g") and, in connection with a list of ranges, applies to each range in the list (e.g., "about 1 g-5 g, 5 g-10 g, etc." should be interpreted as "about 1 g—about 5 g, about 5 g—about 10 g, etc.").

Turning now to an overview of technologies relevant to aspects of the present disclosure, Hall measurements are among the most widely used semiconductor characterization techniques used in research and industry. Measuring Hall effect yields fundamental properties of the majority charge carrier inside the electronics materials such as carrier type, charge density, mobility. A basic Hall effect measurement can involve passing electric current through the sample and subjecting the sample to a perpendicular magnetic field. The longitudinal resistance of the sample can be measured under zero magnetic field, and the transverse resistance of the sample can be measured under an applied magnetic field.

While the basic Hall effect allows extraction of majority carrier information, minority carrier information is more difficult to obtain. However, the minority carrier properties are important for many semiconductor applications. For example, minority carrier properties can be used to characterize semiconductor applications involving light (e.g., solar cells, light emitting diodes, photodetectors, photochemical junctions, etc.). Traditional techniques for measuring minority carrier properties can require sets of different measurements, such as time-resolved photoluminescence and terahertz spectroscopy, which can become complicated and expensive.

However, minority charge carrier information may also be obtained using carrier-resolved photo-Hall (CRPH) measurement techniques. CRPH measurements utilize an alternating current (AC) or oscillating magnetic field Hall measurement system using a rotating parallel dipole line (PDL) magnet system and a formula for determining the difference between hole mobility and electron mobility based on Hall effect measurements in the presence of light. Based on the mobility difference, many parameters from the material being tested can be found, such as mobility, carrier density and diffusion lengths for both electrons and holes.

Embodiments of the present disclosure may increase the efficiency of CRPH measurement techniques. CRPH measurements are made at more than one light intensity. This has required repetition of measurements wherein the intensity of a light source is adjusted at each repetition. However, the disclosed system can reduce the number of measurements and/or increase the speed of measurements by applying a light on a sample and collecting Hall measurements as the light intensity decays or increases. In some embodiments, the sample is exposed to light that is slowly varied while resistance is measured. In other embodiments, the sample is exposed to light that is flashed and ended abruptly, as with a light pulse, and measurements may be performed as the sample conductance decays to its equilibrium state (e.g., no light or full light exposure). Therefore, this system could perform rapid CRPH measurements suitable for in-line test and manufacturing environment.

Figure 1:
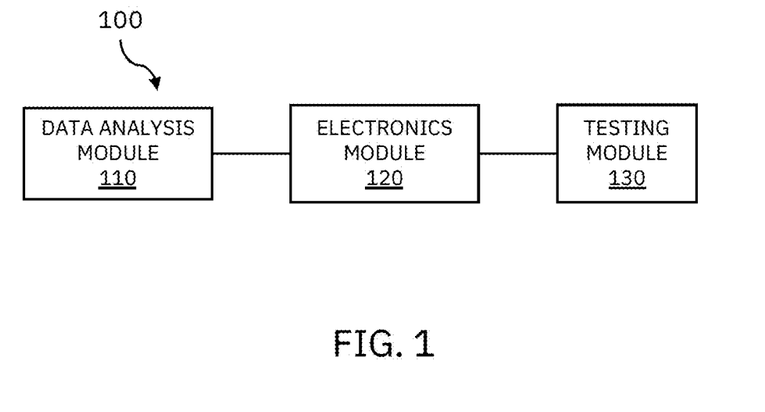
FIG. 1 is a block diagram illustrating a semiconductor characterization environment, according to some embodiments of the present disclosure.

Referring now to the drawings, in which like numerals represent the same or similar elements, FIG. 1 is a block diagram illustrating a semiconductor characterization environment 100, according to some embodiments of the present disclosure. The characterization environment 100 includes a data analysis module 110 for instrument control, data acquisition, data analysis, etc. Instruments that can be controlled by data analysis module 110 are included in an electronics module 120. The electronics module 120 can contain components for source and measure operations, switch matrix and buffering, motor control, field sensing, temperature control, etc. Components of the electronics module 120 electrically communicate with a testing module 130. The testing module 130 includes components for carrying out Hall measurements such as a sample stage, measurement chamber, magnets, a light source, sensors, etc. Components of the data analysis module 110, electronics module 120, and testing module 130 are discussed in greater detail with respect to FIG. 2.

Figure 2:
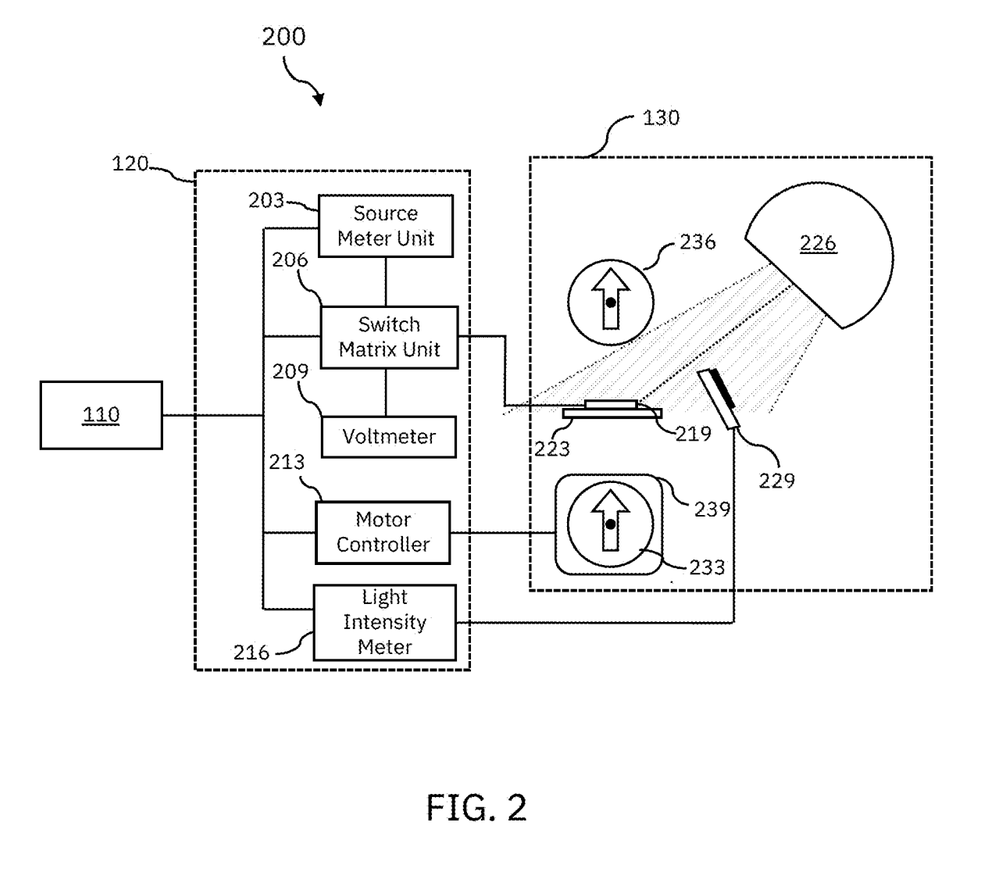
FIG. 2 is a schematic diagram illustrating a semiconductor characterization environment, according to some embodiments of the present disclosure.

FIG. 2 is a schematic diagram illustrating a semiconductor characterization environment 200, according to some embodiments of the present disclosure. Characterization environment 200 includes example components that can be used in the data analysis module 110, electronics module 120, and testing module 130 of FIG. 1. The data analysis module 110 can communicate with electronic components of module 120 including a source meter unit 203, a switch matrix unit 206, a voltmeter 209, a motor controller 213, and a light intensity meter 216. To do so, the data analysis module 110 can use any software appropriate for instrument control and data acquisition system, a display and user interface, etc. The electrical measurements can be automated using electrical testing equipment including the source measure unit 203, switch matrix unit 206, and voltmeter 209. The electrical testing equipment 203, 206, and 209 can be selected from any instruments known in the art that are appropriate for measuring the resistance and Hall coefficient of a sample 219 in the testing module 130. The data analysis module 110 can receive measurements made using the testing module 130 from the electronics 120. The data analysis module 110 can then calculate parameters for sample characterization based on these measurements. This is discussed in greater detail with respect to FIG. 4 (e.g. at operations 440 and 450) and FIGS. 5A-5C.

Figure 3A:
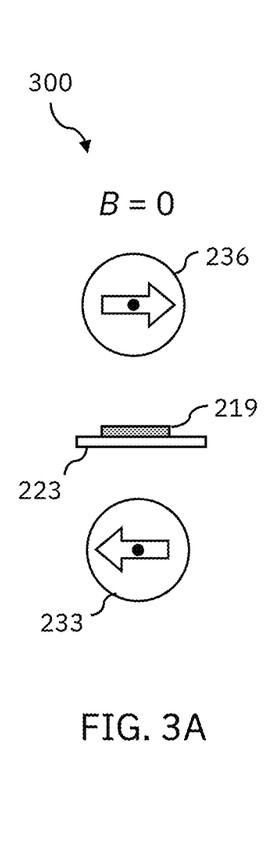
FIGS. 3A-3C are schematic diagrams illustrating magnetic configurations used during sample characterization, according to some embodiments of the present disclosure.
Figure 3B:
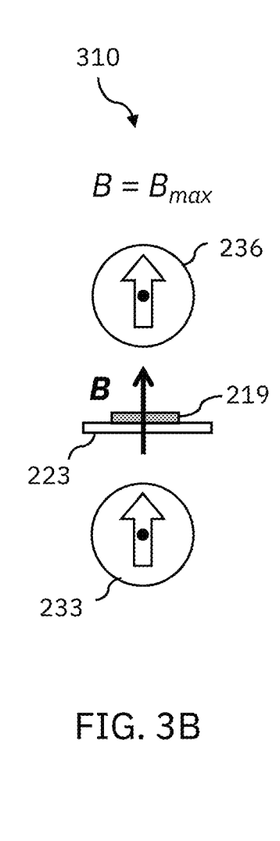
Figure 3C:
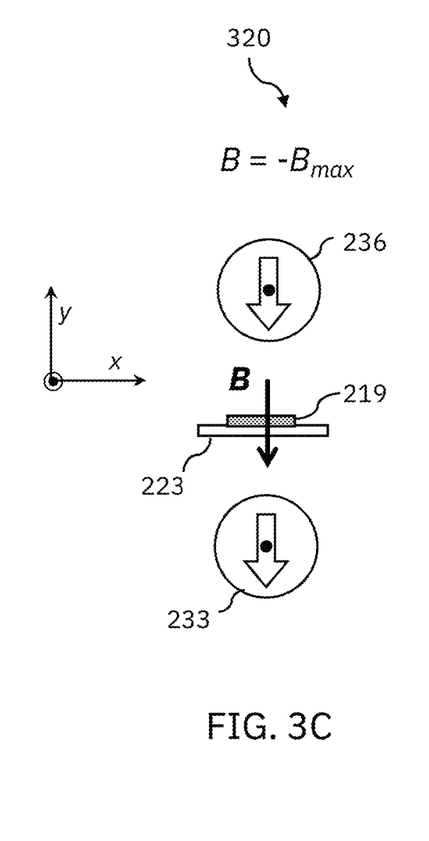

In the testing module 130, a device under test (the sample 219) can be enclosed in a measurement chamber (not shown) with a rotating parallel dipole line (PDL) system. The PDL system includes two cylindrical diametric ("dipole line") magnets 233 and 236 separated by a gap. The sample 219 can be mounted on a sample stage 223 and positioned in the gap between magnets 233 and 236. In the testing module 130, the motor controller 213 can direct a motor 239 (e.g., a stepper motor and gearbox) to rotate one dipole line magnet 233 ("motor-driven magnet 233"). The second dipole line magnet 236 ("freely-rotating magnet 236") can rotate freely and will mirror the orientation of the motor-driven magnet 233. This produces a unidirectional and single harmonic field at the center of the PDL system, where the sample 219 is mounted. Examples of magnetic field settings are illustrated in FIGS. 3A-3C.

The electronics module 120 can include a switch matrix unit 206 to connect terminals of the device under test (sample 219) to the voltmeter 209 and the source meter unit 203, which can include a voltage source, a current source, and an amp-meter for measuring current through the sample 219. The voltmeter 209 can measure voltage across a pair of terminals of the device/sample 219 and, in some embodiments, may include one or two channels for simultaneous measurement of magnetoresistance signals. These components 203, 206, and 209 can communicate with data analysis module 110 via a bus interface with a microcomputer (not shown) in the electronics module 120.

Individual electrodes connecting the switch matrix unit 206 to the sample 219 are not illustrated in FIG. 2. However, various electrical contact arrangements may be used. In some embodiments, the sample 219 has at least 4 terminals for voltage/current sourcing and voltage or magnetoresistance measurement. For example, the sample 219 can be a four-terminal van der Pauw device or six-terminal Hall bar test structure.

The light source 226 in the testing module 130 can be used to flash light on the sample 219 when measuring magnetoresistance. The light source could have broadband wavelength spectrum such as a Xenon lamp or monochromatic source such as a laser. The intensity of the light from the flash can be monitored by the light meter 216, using a photodetector 229 positioned in the testing module 130, in order to measure intensity of the light pulse with time for both the onset and decay of a light exposure.

FIGS. 3A-3C are schematic diagrams illustrating a PDL system with different magnetic field settings 300, 310, and 320 for photo-Hall effect measurements, according to some embodiments of the present disclosure. The PDL system is discussed with reference to the characterization environment of FIG. 2 and includes the dipole line magnets 233 and 236 of the testing module 130. The magnetic field B applied to the sample 219 during measurements can be controlled by rotating the motor-driven magnet 233. The direction of the total magnetic field is represented by black arrows.

FIG. 3A illustrates a magnetic field B setting 300 of zero. The sample 219 is positioned perpendicular to the magnetic field. FIG. 3B illustrates a maximum magnetic field $B_{max}$ setting 310. This configuration is also illustrated in FIG. 2. FIG. 3C illustrates a minimum magnetic field $-B_{max}$ setting 320. Measurements made at these settings 300, 310, and 320 are discussed in greater detail with respect to FIGS. 4-5B.

Figure 4:
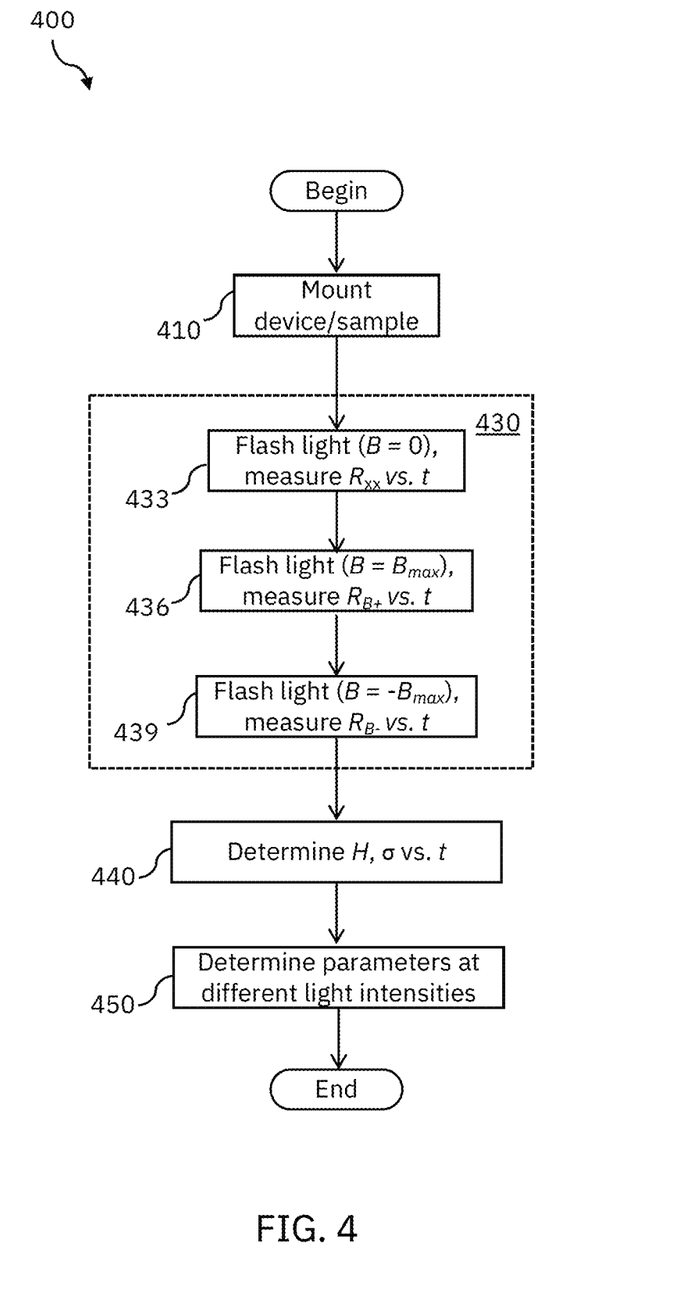
FIG. 4 is a flow diagram illustrating a process of sample characterization, according to some embodiments of the present disclosure.

FIG. 4 is a flow diagram illustrating a process 400 of sample characterization, according to some embodiments of the present disclosure. Process 400 can be used to characterize a semiconductor such as sample 219 using components that are the same as, or substantially similar to, the components of modules 110, 120, and 130 illustrated in FIGS. 1 and 2. Therefore, process 400 is discussed with reference to these figures.

A device under test (sample 219) can be positioned on a sample stage 223 in the testing module 130. A current can then be applied to the device/sample 219. This is illustrated at operation 410. The sample 219 is positioned between a motor-driven magnet 233 and a freely-rotating magnet 236 in a PDL system. This is discussed in greater detail with respect to FIGS. 2 and 3A. The sample 219 is electrically connected to equipment (e.g., switch matrix unit 206) from the electronics module 120. The sample 219 can be enclosed in a measurement chamber, such as a vacuum chamber. The measurement chamber may include a temperature-control component, such as a cryostat system. The semiconductor device characterization of process 400 may be integrated with in-line device testing and fabrication.

Measurements are collected at operation 430, which encompasses operations 433, 436, and 439. While the current is applied to the sample 219, resistance vs. time measurements can be collected at operations 433-439 while applying three magnetic field settings that are illustrated, respectively, in FIGS. 3A-3C. While operations 433-439 refer to light "flashes," the light exposures can be applied for any appropriate duration. For example, each measurement may be carried out with an abrupt light pulse ("transient mode") or under a slowly varying (e.g., decaying) light pulse ("quasi-steady-state mode") provided by the light source 226. Measuring the transient decay of the sample conductivity after a light pulse has been terminated abruptly can be useful for samples with long carrier lifetimes, while measuring a slowly decaying light pulse can be useful for samples with very short lifetimes (e.g., much shorter than the light pulse decay). Operations 430, 440, and 450 are discussed with reference to FIGS. 5A-5C. It should be understood that the charts shown in FIGS. 5A-5C are intended to illustrate hypothetical information that can be obtained by process 400 and do not show real data.

Figure 5A:
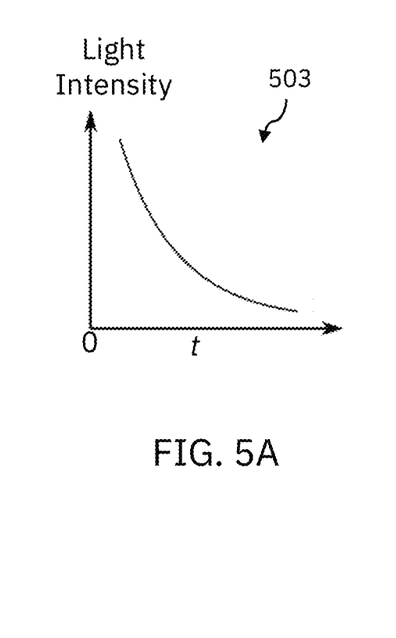
FIG. 5A illustrates a chart representing light intensity vs. time t, according to some embodiments of the present disclosure.

FIG. 5A illustrates a chart 503 representing light intensity vs. time t, according to some embodiments of the present disclosure. At each of operations 433-439, a light can be flashed at t=0. In the quasi-steady state mode, the light intensity decay shown in chart 503 can be monitored by the light intensity meter 216 during resistance measurements shown in FIG. 5B. In other modes of operation (e.g., transient mode) the light can be pulsed abruptly with decay of resistance being measured during and after the light pulse.

Figure 5B:
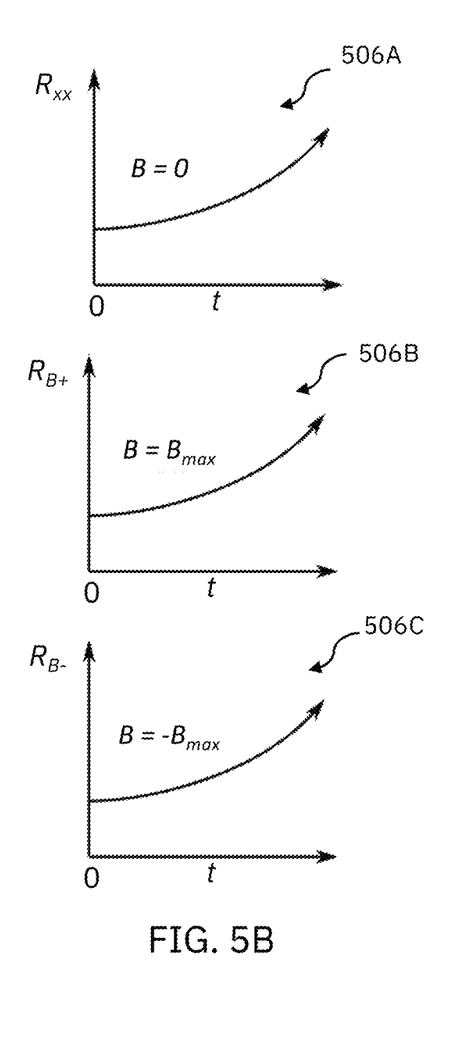
FIG. 5B illustrates charts representing relationships between resistance R and time t measured at operation 430, according to some embodiments of the present disclosure.
Figure 5C:
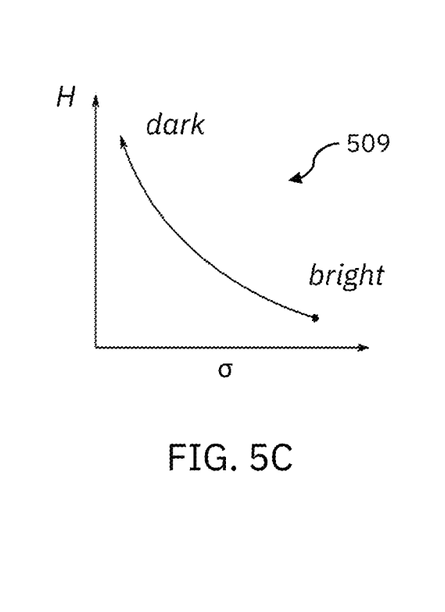
FIG. 5C illustrates a chart representing a relationship between Hall coefficient H and conductivity σ of the sample, according to some embodiments of the present disclosure.

FIG. 5B illustrates charts 506A-506C representing relationships between resistance R and time t measured at operation 430, according to some embodiments of the present disclosure. Current can be applied to the sample 219 in the dark while at zero magnetic field (B=0), as shown in FIG. 3A. At operation 433, light can be flashed (e.g., pulsed or slowly varied) on the sample 219 at t=0, and longitudinal resistance $R_{xx}$ of the sample 219 can be measured under the decaying light flash at B=0. The longitudinal resistance $R_{xx}$ (chart 506A) of the sample 219 and intensity of the light (chart 503) can then be monitored for a period of time t (e.g., for a preset interval, until the photodetector 229 no longer detects light from the flash, etc.).

At operations 436 and 439, the motor-driven magnet 233 can be rotated by the motor 239/motor controller 213 in order to apply a magnetic field B at, respectively, maximum ($B=B_{max}$ and minimum ($B=-B_{max}$) settings, as shown in FIGS. 3B and 3C. A current can be applied to the sample 219 and a light flashed at t=0 using substantially the same techniques as at operation 433. At operation 436, the PDL system can be set to maximum magnetic field while measuring transverse magnetoresistance $R_{B+}$ (chart 506B) of the sample 219 under varying light intensity (e.g., using slowly varied or pulsed light conditions). At operation 439, the PDL system can be set to minimum magnetic field while measuring transverse magnetoresistance $R_{B-}$ (chart 506C) of the sample under varying light intensity (e.g., using substantially the same light conditions as at operations 433 and 436). As at operation 433, light intensity can be simultaneously monitored (chart 503) by the photodetector 229/light intensity meter 216 during operations 436 and 439.

Operation 430 can be repeated in some embodiments. For example, operations 433-439 can each be carried out with a flash of light at a first initial light intensity and then repeated at a second initial light intensity. Additional repetitions may be carried out at further initial intensities or with other variations in experimental conditions known to those of ordinary skill in the art. Operation 430 may also be repeated at more than one light flash/exposure duration. In some embodiments, operations 433-439 can be carried out with an initial exposure to steady light at a given intensity, rather than a flash, followed by light decay or an abrupt removal of the light. As with the light flashes, the initial intensity of the steady light can be varied in subsequent monitoring steps.

The Hall coefficient H and conductivity σ of the sample 219 are determined as functions of time based on the results of operation 430. This is illustrated at operation 440. FIG. 5C illustrates a chart 509 representing a relationship between Hall coefficient H and conductivity σ of the sample 219, according to some embodiments of the present disclosure. The σ-H curve of chart 509 can be used to determine additional information, as shown below.

A set of parameters characterizing the sample 219 can be determined based on a photo-Hall analysis of the data gathered at operation 430 and the σ-H curve generated at operation 440. This is illustrated at operation 450. The set of parameters can include the photo carrier density Δn, hole mobility $\mu_p$, electron mobility $\mu_N$, recombination lifetime τ, hole diffusion length $L_{D,P}$, electron diffusion length $L_{D,N}$, and ambipolar diffusion length $L_{D,am}$ of the sample 219. The photo-Hall analysis can include determining the Hall coefficient and conductivity of the sample 219 (FIG. 5C). The analysis can be carried out by a data analysis module 110 of a computer system (e.g., system 600).

With slowly decaying light intensity or after a light pulse, the longitudinal resistance $R_{xx}$ of the sample 219 will typically increase as the number of carriers in the sample 219 drops. Conductivity σ can be determined as a function of time t, as shown in equation 1:

$$\sigma(t) = \frac{l}{R_{XX}(t)wd} \quad (1)$$

where l, w, and d respectively represent length, width, and thickness of the active area of a Hall bar sample 219. The Hall bar active area is the area defined by the contact leads.

With slowly decaying light intensity or after a light pulse, the Hall coefficient H increases (chart 509). The transverse magnetoresistance measurements $R_{B+}$ and $R_{B-}$ can be used to find the Hall coefficient in equation 2:

$$H(t) = \frac{[R_{B+}(t) - R_{B-}(t)]d}{2B_0} \quad (2)$$

The photo-Hall analysis can be performed with the values σ and H found in equations 1 and 2 and chart 509. This analysis can be used to find charge carrier drift mobilities (electron mobility $\mu_N$ and hole mobility $\mu_p$) because Hall mobility $\mu_H$ and (drift) mobility μ are related by a factor r, called the Hall scattering factor, which is typically close to 1. The relationship between mobility difference Δμ and Hall mobility difference $\Delta\mu_H$ can be expressed as $\Delta\mu = \mu_p - \mu_N = \Delta\mu_H/r$.

The Hall mobility difference $\Delta\mu_H$ can be determined from the σ-H curve (FIG. 5C). This is shown in equation 4:

$$\Delta\mu_H = \frac{d(\sigma^2 H)}{d\sigma} = \left(2 + \frac{d\ln H}{d\ln\sigma}\right)\sigma H \quad (4)$$

The mobility ratio $\beta = \mu_N/\mu_p$ can be determined for P- and N-type materials using equations 5 and 6, respectively.

$$\beta = \frac{2\sigma(r\Delta\mu - \sigma H) - r\Delta\mu^2 ep_0 \pm \Delta\mu\sqrt{ep_0}\sqrt{r^2\Delta\mu^2 ep_0 + 4r\sigma(\sigma H - r\Delta\mu)}}{2\sigma(r\Delta\mu - \sigma H)} \quad (5)$$

$$\beta = \frac{2\sigma(r\Delta\mu - \sigma H) + r\Delta\mu^2 en_0 \pm \Delta\mu\sqrt{en_0}\sqrt{r^2\Delta\mu^2 en_0 + 4r\sigma(\Delta\mu - r\sigma H)}}{2\sigma(r\Delta\mu - \sigma H)} \quad (6)$$

where e is the electron's charge, $p_0$ is the hole density, and $n_0$ is the electron density in the dark for P and N-type material respectively.

The photo-Hall analysis can then determine sample 219 parameters including photo carrier density Δn, hole mobility $\mu_p$, electron mobility $\mu_N$, recombination lifetime τ, hole diffusion length $L_{D,P}$, electron diffusion length $L_{D,N}$, and ambipolar diffusion length $L_{D,am}$. Equations 7-14 illustrate techniques for finding these parameters.

Photo carrier density Δn for a P-type material can be found using equation 7:

$$\Delta n = \Delta p = \frac{\sigma(1-\beta) - e\Delta\mu p_0}{e\Delta\mu(1+\beta)} \quad (7)$$

Photo carrier density Δn for an N-type material can be found using equation 8:

$$\Delta n = \frac{\sigma(1-\beta) - e\Delta\mu n_0 \beta}{e\Delta\mu(1+\beta)} \quad (8)$$

Hole mobility $\mu_p$ can be found using equation 9:

$$\mu_P = \frac{\Delta\mu}{1-\beta} \quad (9)$$

Electron mobility $\mu_N$ can be found using equation 10:

$$\mu_N = \beta\mu_P \quad (10)$$

Recombination lifetime τ can be found using equation 11:

$$\tau = \Delta n / G_\gamma \quad (11)$$

where $G_\gamma$ is the absorbed photon density, which can be calculated from light intensity, absorption coefficient, and reflectivity of the sample material using techniques known in the art.

Hole diffusion length $L_{D,P}$, electron diffusion length $L_{D,N}$, and ambipolar diffusion length $L_{D,am}$ can be determined using, respectively, equations 12, 13, and 14:

$$L_{D,P} = \sqrt{D\tau} = \sqrt{k_B T \mu_P \tau / e} \quad (12)$$

$$L_{D,N} = \sqrt{D\tau} = \sqrt{k_B T \tau / e} \quad (13)$$

$$L_{D,am} = \sqrt{\frac{k_B T \tau}{e} \frac{n+p}{n/\mu_P + p/\mu_N}} \quad (14)$$

where D is the diffusion coefficient, $k_B$ is the Boltzmann constant, and T is the temperature of the sample 219 material.

The photo carrier density Δn, hole mobility $\mu_p$, electron mobility $\mu_N$, recombination lifetime τ, hole diffusion length $L_{D,P}$, electron diffusion length $L_{D,N}$, and ambipolar diffusion length $L_{D,am}$ can be calculated at different light intensities as the intensity decays from bright to dark. Similarly, in the transient mode of operation, the same variables can be calculated by analyzing the resistance/conductance of the sample at the start or end of a light pulse. Operation 430 may optionally be repeated to provide new plots of Hall coefficient versus conductivity under, for example, different light intensities and/or durations.

Figure 6:
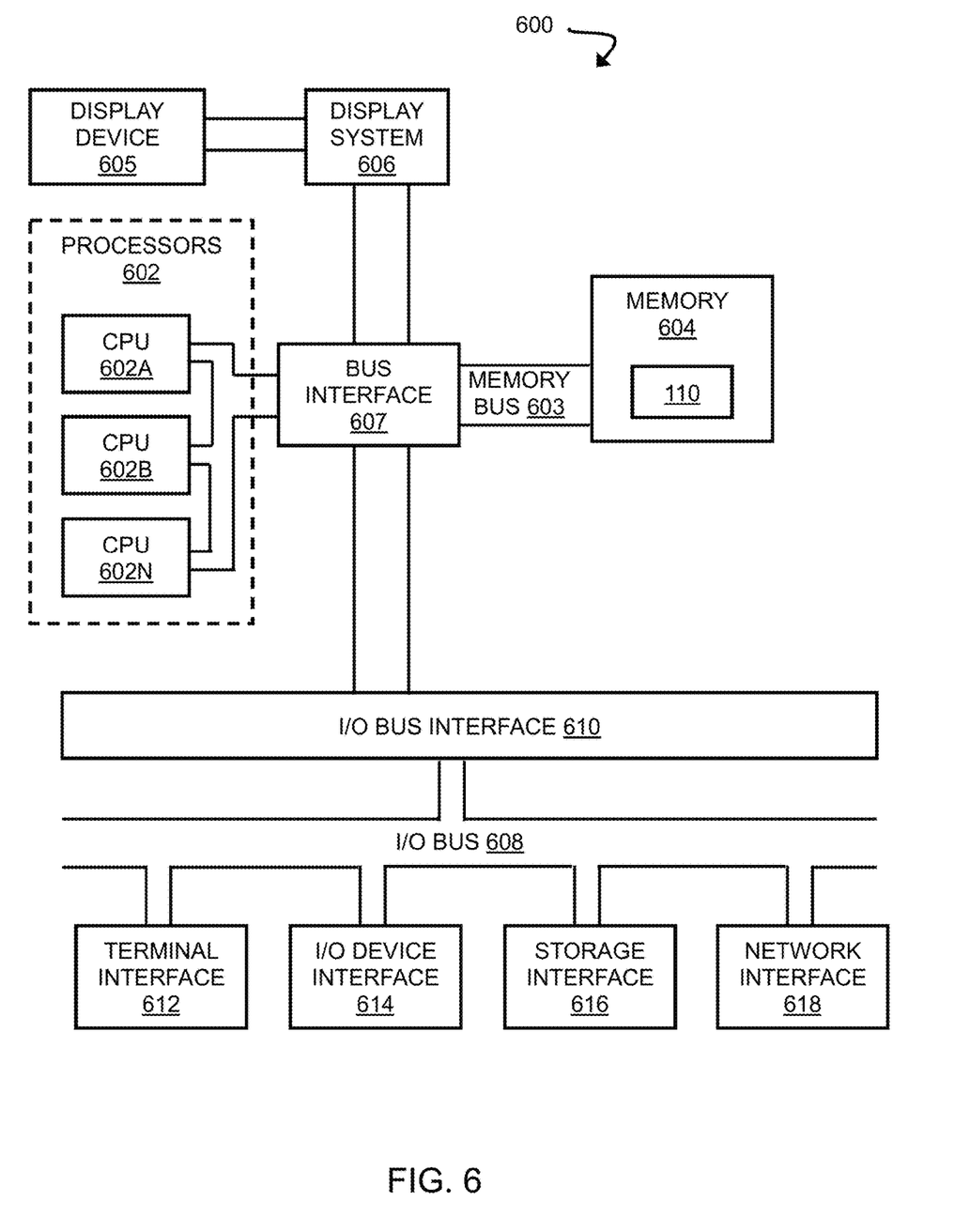
FIG. 6 is a block diagram illustrating a computer system, according to some embodiments of the present disclosure.

FIG. 6 is a block diagram illustrating a computer system 600, according to some embodiments of the present disclosure. The computer system 600 can be used in implementing one or more of the methods, tools, components, and any related functions described herein (e.g., using one or more processor circuits or computer processors of the computer). In some embodiments, the major components of the computer system 600 comprise one or more processors 602, a memory subsystem 604, a terminal interface 612, a storage interface 616, an input/output device interface 614, and a network interface 618, all of which can be communicatively coupled, directly or indirectly, for inter-component communication via a memory bus 603, an input/output bus 608, bus interface unit 607, and an input/output bus interface unit 610.

The computer system 600 contains one or more general-purpose programmable central processing units (CPUs) 602A, 602B, and 602-N, herein collectively referred to as the CPU 602. In some embodiments, the computer system 600 contains multiple processors typical of a relatively large system; however, in other embodiments the computer system 600 can alternatively be a single CPU system. Each CPU 602 may execute instructions stored in the memory subsystem 604 and can include one or more levels of on-board cache.

The memory 604 can include a random-access semiconductor memory, storage device, or storage medium (either volatile or non-volatile) for storing or encoding data and programs. In some embodiments, the memory 604 represents the entire virtual memory of the computer system 600 and may also include the virtual memory of other computer systems coupled to the computer system 600 or connected via a network. The memory 604 is conceptually a single monolithic entity, but in other embodiments the memory 604 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory can be further distributed and associated with different CPUs or sets of CPUs, as is known in any of various so-called non-uniform memory access (NUMA) computer architectures.

The data analysis module 110 (FIG. 1), is illustrated as being included within the memory 604 in the computer system 600. However, in other embodiments, components of the data analysis module 110 may be on different computer systems and may be accessed remotely, e.g., via a network. The computer system 600 may use virtual addressing mechanisms that allow the programs of the computer system 600 to behave as if they only have access to a large, single storage entity instead of access to multiple, smaller storage entities. Thus, though the data analysis module 110 is illustrated as being included within the memory 604, components of the memory 604 are not necessarily all completely contained in the same storage device at the same time. Further, although these components are illustrated as being separate entities, in other embodiments some of these components, portions of some of these components, or all of these components may be packaged together.

In an embodiment, the data analysis module 110 includes instructions that execute on the processor 602 or instructions that are interpreted by instructions that execute on the processor 602 to carry out the functions as further described in this disclosure. In another embodiment, the data analysis module 110 is implemented in hardware via semiconductor devices, chips, logical gates, circuits, circuit cards, and/or other physical hardware devices in lieu of, or in addition to, a processor-based system. In another embodiment, the data analysis module 110 includes data in addition to instructions.

Although the memory bus 603 is shown in FIG. 6 as a single bus structure providing a direct communication path among the CPUs 602, the memory subsystem 604, the display system 606, the bus interface 607, and the input/output bus interface 610, the memory bus 603 can, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the input/output bus interface 610 and the input/output bus 608 are shown as single respective units, the computer system 600 may, in some embodiments, contain multiple input/output bus interface units 610, multiple input/output buses 608, or both. Further, while multiple input/output interface units are shown, which separate the input/output bus 608 from various communications paths running to the various input/output devices, in other embodiments some or all of the input/output devices may be connected directly to one or more system input/output buses.

The computer system 600 may include a bus interface unit 607 to handle communications among the processor 602, the memory 604, a display system 606, and the input/output bus interface unit 610. The input/output bus interface unit 610 may be coupled with the input/output bus 608 for transferring data to and from the various input/output units. The input/output bus interface unit 610 communicates with multiple input/output interface units 612, 614, 616, and 618, which are also known as input/output processors (IOPs) or input/output adapters (IOAs), through the input/output bus 608. The display system 606 may include a display controller. The display controller may provide visual, audio, or both types of data to a display device 605. The display system 606 may be coupled with a display device 605, such as a standalone display screen, computer monitor, television, or a tablet or handheld device display. In alternate embodiments, one or more of the functions provided by the display system 606 may be on board a processor 602 integrated circuit. In addition, one or more of the functions provided by the bus interface unit 607 may be on board a processor 602 integrated circuit.

In some embodiments, the computer system 600 is a multi-user mainframe computer system, a single-user system, or a server computer or similar device that has little or no direct user interface but receives requests from other computer systems (clients). Further, in some embodiments, the computer system 600 is implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 600. In some embodiments, however, individual components may have greater or lesser complexity than as represented in FIG. 6, Components other than or in addition to those shown in FIG. 6 may be present, and the number, type, and configuration of such components may vary.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the present disclosure.

What is claimed is:

1. A system, comprising:
a parallel dipole line (PDL) system configured to apply a magnetic field to a sample in a measurement chamber; and
electrical equipment configured to test the sample, the testing comprising:
with the PDL system set to zero magnetic field, applying a first light exposure to the sample;

monitoring longitudinal resistance ($R_{xx}$) of the sample as light intensity of the first light exposure varies;

with the PDL system set to maximum magnetic field, applying a second light exposure to the sample;

monitoring transverse magnetoresistance ($R_{B+}$) of the sample as light intensity of the second light exposure varies;

with the PDL system set to minimum magnetic field, applying a third light exposure to the sample; and monitoring transverse magnetoresistance ($R_{B-}$) of the sample as light intensity of the third light exposure varies.

2. The system of claim 1, wherein the electrical equipment comprises:
a source meter unit;
a switch matrix unit;
a voltmeter
a motor controller; and
a photodetector.

3. The system of claim 2, wherein the photodetector is configured to monitor light intensity in the measurement chamber.

4. The system of claim 1, further comprising a data analysis module configured to:
determine, based on the monitored $R_{xx}$, conductivity $\sigma$ of the sample as a function of time; and
determine, based on the monitored $R_{B+}$ and $R_{B-}$, Hall coefficient H of the sample as a function of time.

5. The system of claim 4, wherein the data analysis module is further configured to generate a $\sigma$-H curve for the sample.

6. The system of claim 1, wherein the applying each of the first, second, and third light exposures comprises slowly varying the light intensities.

7. The system of claim 1, wherein the applying each of the first, second, and third light exposures comprises applying a light pulse.

8. A method of semiconductor testing, comprising:
mounting a sample in a measurement chamber with a parallel dipole line (PDL) system;
with the PDL system set to zero magnetic field, applying a first light exposure to the sample;
monitoring longitudinal resistance ($R_{xx}$) of the sample as light intensity of the first light exposure varies;
with the PDL system set to maximum magnetic field, applying a second light exposure to the sample;
monitoring transverse magnetoresistance ($R_{B+}$) of the sample as light intensity of the second light exposure varies;
with the PDL system set to minimum magnetic field, applying a third light exposure to the sample; and
monitoring transverse magnetoresistance ($R_{B-}$) of the sample as light intensity of the third light exposure varies.

9. The method of claim 8, further comprising:
determining, based on the monitored $R_{xx}$, conductivity $\sigma$ of the sample as a function of time; and
determining, based on the monitored $R_{B+}$ and $R_{B-}$, Hall coefficient H of the sample as a function of time.

10. The method of claim 9, further comprising generating a $\sigma$-H curve for the sample.

11. The method of claim 10, further comprising determining a Hall mobility difference $\Delta\mu_H$ for the sample using the following equation:

$$\Delta\mu_H = \frac{d(\sigma^2 H)}{d\sigma} = \left(2 + \frac{d\ln H}{d\ln\sigma}\right)\sigma H.$$

12. The method of claim 11, further comprising determining a mobility ratio $\beta$ for the sample.

13. The method of claim 12, further comprising determining, for the sample, at least one parameter selected from the group consisting of photo carrier density $\Delta n$, hole mobility $\mu_p$, electron mobility $\mu_N$, recombination lifetime ti, hole diffusion length $L_{D,P}$, electron diffusion length $L_{D,N}$, and ambipolar diffusion length $L_{D,am}$.

14. The method of claim 8, further comprising monitoring the light intensities of the first, second, and third light exposures.

15. The method of claim 8, wherein the applying each of the first, second, and third light exposures comprises slowly varying the light intensities.

16. The method of claim 15, wherein the varying comprises decreasing the light intensities.

17. The method of claim 8, wherein the applying each of the first, second, and third light exposures comprises applying a light pulse.

18. A method of semiconductor characterization, comprising:
carrying out a photo-Hall analysis of a sample based on data from testing the sample in a measurement chamber with a parallel dipole line (PDL) system, wherein the testing comprises:
with the PDL system set to zero magnetic field, applying a first light exposure to the sample;
monitoring longitudinal resistance ($R_{xx}$) of the sample as light intensity of the first light exposure varies;
with the PDL system set to maximum magnetic field, applying a second light exposure to the sample;
monitoring transverse magnetoresistance ($R_{B+}$) of the sample as light intensity of the second light exposure varies;
with the PDL system set to minimum magnetic field, applying a third light exposure to the sample; and
monitoring transverse magnetoresistance ($R_{B-}$) of the sample as light intensity of the third light exposure varies.

19. The method of claim 18, wherein the photo-Hall analysis comprises:
determining, based on the monitored $R_{xx}$, conductivity $\sigma$ of the sample as a function of time; and
determining, based on the monitored $R_{B+}$ and $R_{B-}$, Hall coefficient H of the sample as a function of time.

20. The method of claim 19, wherein the photo-Hall analysis further comprises generating a $\sigma$-H curve for the sample.

* * * * *